United States Patent [19]

Allen

[11] Patent Number: 5,546,016

[45] Date of Patent: Aug. 13, 1996

[54] MOS TERMINATION FOR LOW POWER SIGNALING

[75] Inventor: Michael J. Allen, Rescue, Calif.

[73] Assignee: Intel Corporation, Santa Clara, Calif.

[21] Appl. No.: 497,919

[22] Filed: Jul. 3, 1995

[51] Int. Cl.⁶ .................... H03K 17/16; H03K 19/003
[52] U.S. Cl. ................................................ 326/30
[58] Field of Search ......................... 326/30; 327/310, 327/313, 321

[56] References Cited

U.S. PATENT DOCUMENTS

| | | | |
|---|---|---|---|
| 4,029,971 | 6/1977 | Pryor | 326/30 |
| 5,023,488 | 6/1991 | Gunning | 326/30 |
| 5,027,008 | 6/1991 | Runaldue | 326/30 |
| 5,347,177 | 9/1994 | Lipp | 326/30 |
| 5,420,526 | 5/1995 | Fensch | 326/30 |

OTHER PUBLICATIONS

"A 500-Megabyte/s Data-Rate 4.5M DRAM", Kushiyama, et al., *IEEE Journal on Solid-State Circuits*, vol. 28, No. 4, Apr. 1993, pp. 490–498.

"A Dynamic Lin-Termination Circuit for Multireceiver Nets", Dolle, *IEEE Journal on Solid-State Circuits*, vol. 28, No. 12, Dec. 1993, pp. 1370–1373.

"WP 3.7: A CMOS Low-Voltage-Swing Transmission-Line Transceiver", Gunning, et al., *1992 IEEE International Solid-State Circuits Confeence*, pp. 58–59.

"The Art of Electronics", Horowitz, et al., *Cambridge University Press 1980*, p. 42.

*Primary Examiner*—Edward P. Westin
*Assistant Examiner*—Richard Roseen
*Attorney, Agent, or Firm*—Blakely, Sokoloff, Taylor & Zafman

[57] ABSTRACT

A low power termination method and apparatus. The termination circuit is typically coupled to a bus through an interface node to receive a rising edge of an input voltage signal. A clamping device is coupled to the interface node and coupled to receive a clamping voltage, the clamping voltage being less than a termination voltage. The termination circuit also includes a bias supply providing a bias voltage. A control terminal of the clamping device is coupled receive the bias voltage, and clamps the interface node when the input voltage signal exceeds a termination voltage. A bias excursion of the bias voltage may be provided responsive to the rising edge so that the clamping device clamps the interface node before the input voltage signal exceeds the termination voltage. Similarly, a second clamping device biased by a second bias supply may be used. The second clamping device clamps the interface node after the input voltage signal falls below an expected low voltage. The second bias supply can provide an excursion responsive to a falling edge of the input voltage signal so that the second clamping device clamps the interface node before the input voltage falls below the expected low voltage.

23 Claims, 3 Drawing Sheets

MOS TERMINATION FOR LOW POWER SIGNALING

FIELD OF THE INVENTION

The present invention pertains to the field of information transmission between computer system components and specifically, circuits and methods for terminating signal lines.

BACKGROUND

In a typical computer system, numerous signal lines are used to connect integrated circuits. Information is transmitted between integrated circuits over these signal lines through different signal levels, with the ability to switch from one signal level to another often being the factor limiting the maximum rate of information transmission. The ability to switch a signal line is not only affected by the characteristics of the driver that is causing the transition, but also by the characteristics of the signal line, the other devices attached to the signal line, and the termination, if any, of the signal line.

At least one integrated circuit coupled to a signal line typically has an output buffer for driving the signal line. As technology progresses, these output buffers are able to drive signals having faster transitions. The higher frequency components inherent in the faster transitions are well known to increase various transmission line effects including ringing and wave reflection. Thus, increasing measures are required to compensate for transmission line effects.

Many prior art signaling schemes utilize "open" termination in which signal lines are terminated in a high impedance input buffer or a tristated output buffer. Many of these schemes include diodes for electrostatic discharge (ESD) protection. FIG. 1 shows a prior art circuit in which an output buffer 122 drives data from a data line 124 when enabled using an enable line 126. In this prior art signaling scheme, a signal line is switched between a Vcc potential and a Vss potential. When output buffer 122 is tristated, an ESD diode 120 clamps voltage swings on an interface node 125 of more than one diode drop over the Vcc potential to which the diode is coupled. ESD diode 130 clamps voltage swings of more than one diode drop under the Vss potential to which it is coupled.

Voltage wave reflections result when a voltage wave reaches an impedance mismatch at the interface between a signal line and a high impedance termination. ESD diodes provide some reflection limitation; however, the remaining reflections may still result in system malfunction due to the overdriving of other devices. Also, an initial reflection from a high impedance end of the signal line may be again reflected by the driver, resulting in multiple reflections with the possibility of causing receivers to sample improper signal levels. Finally, as switching frequencies and edge rates increase, reflections and other transmission line effects in a system with "open" ended signal lines tend to worsen.

Due to the problems posed by reflections on signal lines with "open" terminations, a variety of signal line terminations are used. One common signaling scheme terminates a signal line to a fixed potential using a termination resistor. The signal line may be terminated to Vcc, ground, or an intermediate potential through the termination resistor. Using a termination reduces incident wave reflection, typically allowing receivers to properly sample the signal line upon receiving the incident wave (i.e. incident wave switching). Assuming the termination resistor is connected to Vcc, a high logic level appears on the signal line as Vcc. A low logic level appears on the signal line as a voltage with a magnitude greater than Vss determined according to the ratio of signal driver impedance to the total of the driver and the termination impedances. While the voltage swing is reduced as compared to the "open" termination case, the reduction in reflections and the ability to utilize incident wave switching make resistively terminated signal lines a solution for some applications.

While resistively terminated signal lines may reduce reflections, they can have the disadvantage of increasing power consumption. In a system with a resistive termination to Vcc, an output buffer driving a signal line to ground draws continuous current through the resistor. Considering the increasing importance of power savings in computer systems, the increased power consumption of a typical resistive termination scheme is a significant disadvantage.

One prior art scheme which may reduce some of the problems with resistively terminated signal lines is addressed in "A Dynamic Line-Termination Circuit for Multireceiver Nets", *IEEE Journal on Solid-State Circuits*, Vol. 28, No. 12, December 1993. Here the receiver terminates a line to incoming signal values. This scheme essentially implements a keeper formed by an input buffer and an active termination device which immediately drives values back onto the line. The keeper thus latches values as they are received on the signal line. Since the termination device terminates the signal line to the signal value being driven, there is not continuous additional power consumption due to the termination; however, the switching of the active termination device during an incident voltage wave can produce a step voltage on the signal line.

In a typical application, many such dynamic termination circuits are used on a signal line, and each termination circuit will contribute to signal line noise with its step voltage, resulting in the incident voltage wave being altered by each of the termination circuits. These noise causing step voltages occur at different times since the receivers are generally located at different distances from the output buffer. Additionally, once all of the receivers have switched and are terminating the signal line to its present value, the next time a driver tries to drive the opposite value on the signal line, it will have to overcome all of the active termination devices. This may result in poor performance in a system with many receivers. Thus the dynamic line termination scheme addresses the power consumption disadvantage of resistively terminated signal lines, but has some shortcomings of its own.

SUMMARY OF THE INVENTION

The present disclosure describes a termination circuit which is coupled to an interface node to receive an input voltage signal. A clamping device having a threshold voltage is coupled to the interface node and coupled to receive a clamping voltage. The termination circuit also includes a bias supply which has a bias voltage having an equilibrium voltage of approximately the threshold voltage less than the termination voltage. A control terminal of the clamping device is coupled to receive the bias voltage, and the clamping device clamps the interface node if the input voltage signal exceeds the bias voltage by the threshold voltage. A bias excursion of the bias voltage may be provided responsive to a transition from a first voltage to the termination voltage, the first voltage being less than the termination voltage.

The termination circuit may also include a second clamping device having a second threshold voltage. The second clamping device is also coupled to the interface node and coupled to receive a second clamping voltage. When the second clamping device is used, the termination circuit also includes a second bias supply which has a second bias voltage having a second equilibrium voltage of approximately the second threshold voltage greater than the first voltage. A control terminal of the second clamping device is coupled to receive the second bias voltage, and the second clamping device clamps the interface node if the input voltage signal falls below the second bias voltage by the second threshold voltage. A second bias excursion of the second bias voltage may be provided responsive to a second transition from the termination voltage to the first voltage.

BRIEF DESCRIPTION OF THE FIGURES

The present invention is illustrated by way of example and not limitation in the figures of the accompanying drawings.

DETAILED DESCRIPTION

A termination circuit for low power signaling is described. In the following description, numerous specific details are set forth, such as device technologies, voltage levels, and signaling nomenclature, in order to provide a thorough understanding of an embodiment of the present invention. It will be apparent to those skilled in the art that the present invention may be practiced without these specific details.

OVERVIEW

Figure 2:
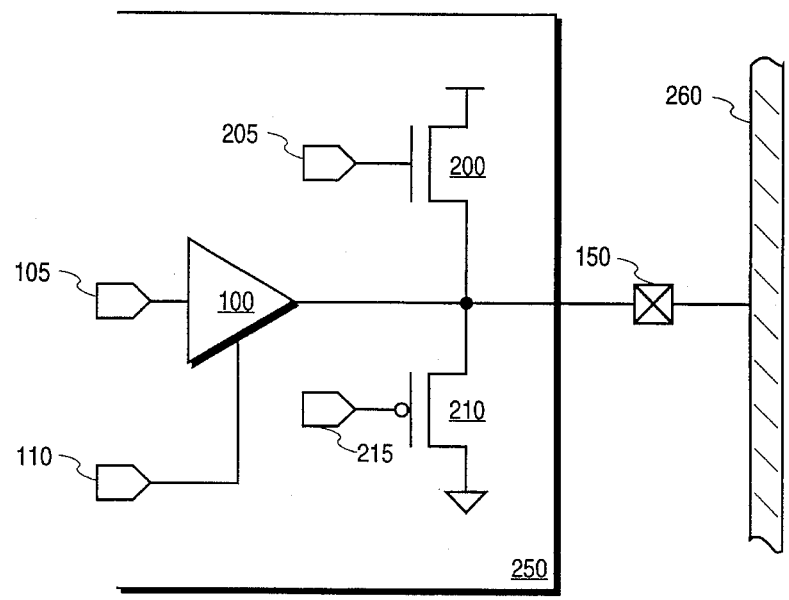
FIG. 2 is a schematic representation of an embodiment of the termination circuit of the present invention.

The invented termination circuit, as illustrated in FIG. 2, limits overshoot and undershoot of an input voltage signal received on an interface node 150. A first transistor, transistor 210, is a first clamping device limiting input voltage signal overshoot above a termination voltage when a proper bias voltage is applied to a bias line 215. A second transistor, transistor 200, is a second clamping device limiting input voltage signal undershoot below an expected low voltage when a proper bias voltage is applied to a bias line 205. Transistors 200 and 210 are biased via their gates to be substantially off and therefore dissipate little power when the input voltage signal remains between the termination voltage and the expected low voltage. This provides significant power savings over a simple resistive termination coupled to a power supply voltage. Such a resistive termination causes power dissipation whenever the signal line is driven to any voltage other than this power supply voltage.

Figure 5:
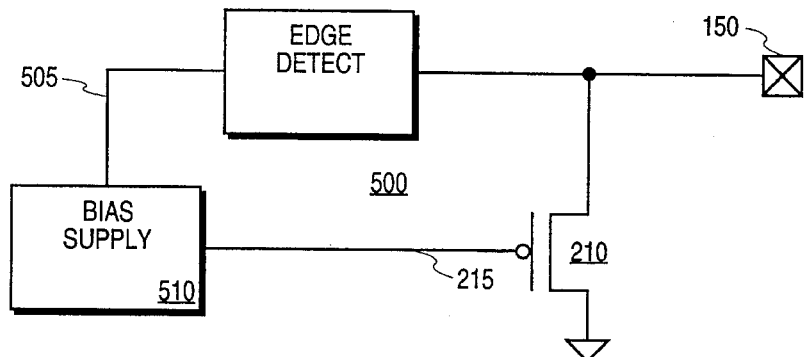
FIG. 5 is a schematic representation of an embodiment of the present invention.

If enhanced clamping ability is desired, an anticipatory bias excursion may be provided in response to transitions of the input voltage signal. The excursion of the bias voltage is generated in response to switching of the input voltage signal in anticipation of overshoot or undershoot. FIG. 5 illustrates an embodiment in which a varying bias is applied to the gate of transistor 210. This approach could be used with either or both transistors 200 and 210 of FIG. 2. The embodiment of FIG. 5 reduces the equilibrium bias voltage provided on bias line 215 responsive to the detection of a rising edge of the input voltage signal. This causes the clamping device, transistor 210, to turn on before the input voltage signal reaches the termination voltage, providing increased clamping.

Figure 3:
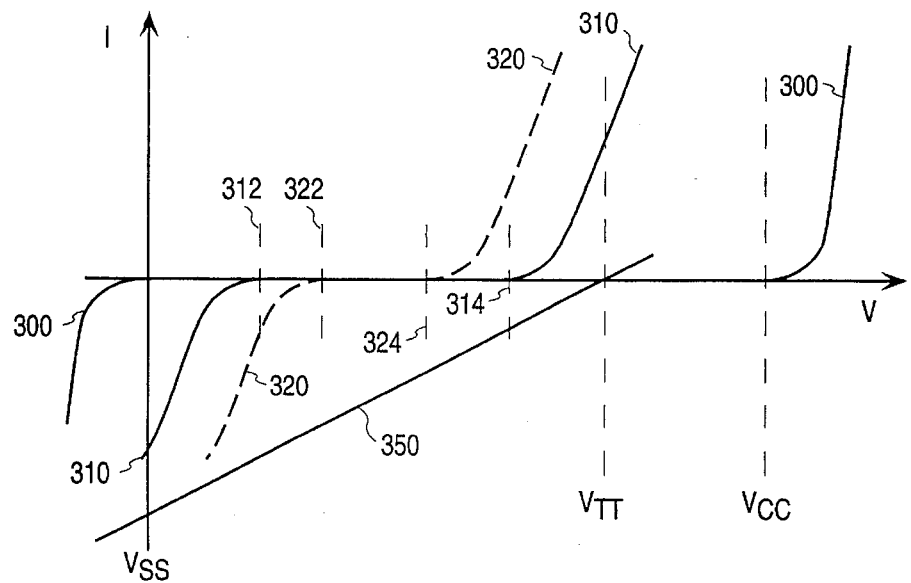
FIG. 3 is a graph illustrating voltage-current (VI) characteristics of prior art termination circuits and of an embodiment of the present invention.
Figure 4:
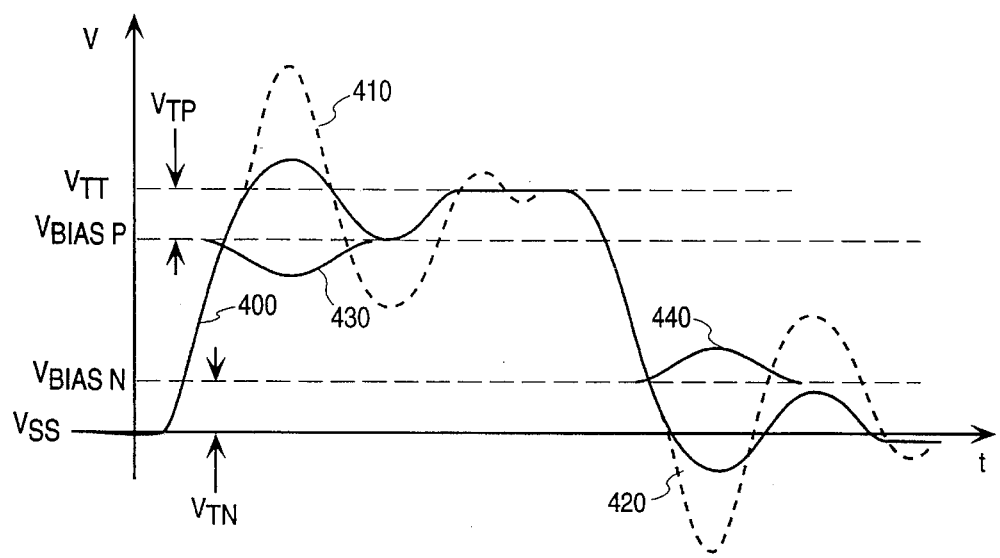
FIG. 4 is a timing diagram illustrating the operation of an embodiment of the present invention.

This anticipatory bias excursion is illustrated with respect to other voltage waveforms as a bias excursion 430 in FIG. 4. The effect of this bias excursion, which provides a transient bias reduction, is also illustrated in FIG. 3 in terms of the movement from a VI characteristic 310 at marker 314 to a VI characteristic 320 at marker 324. Alternately, the equilibrium bias voltage on bias line 215 could be increased to conserve power, with the bias excursion being used to ensure sufficient clamping.

Figure 6:
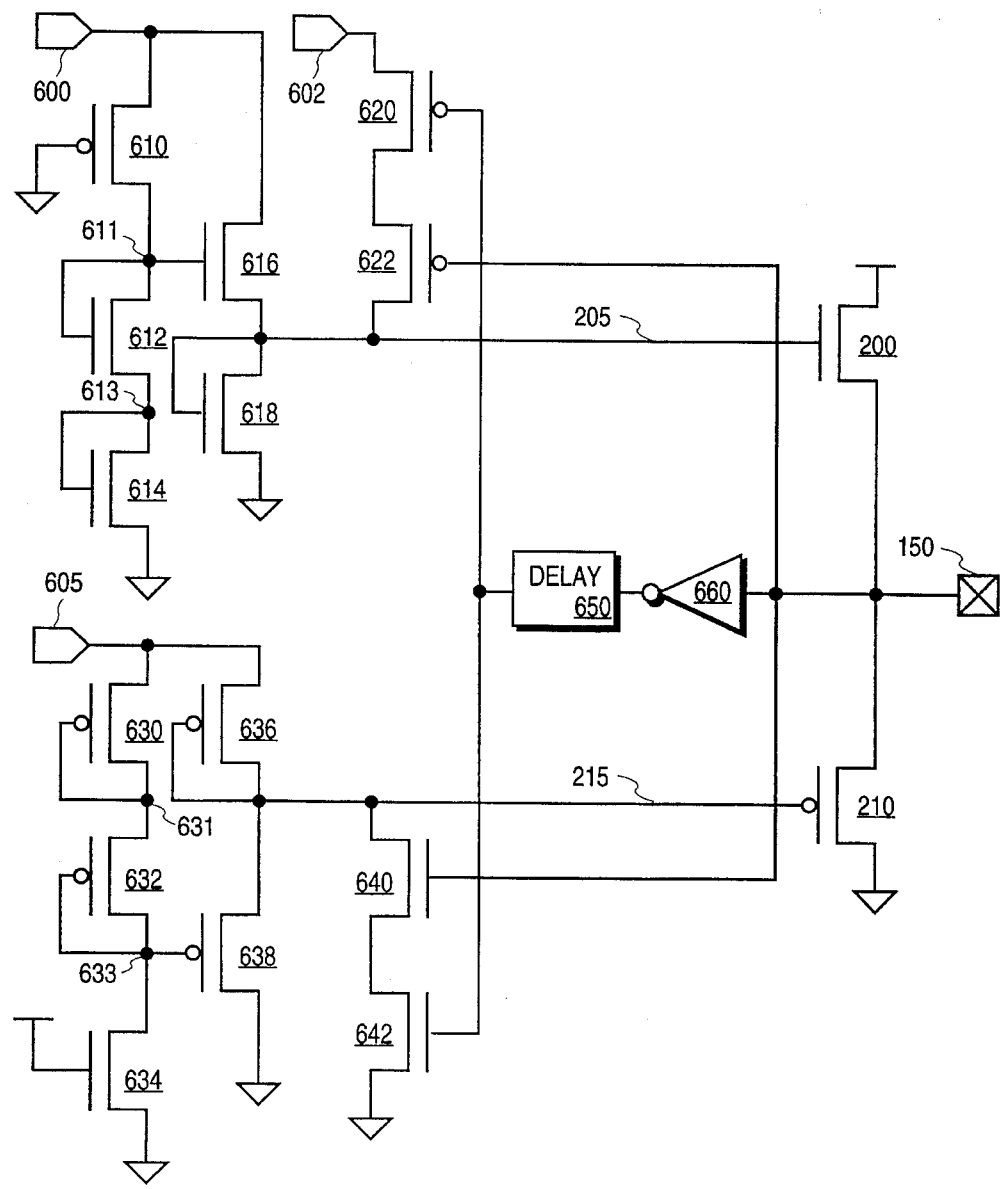
FIG. 6 is a detailed schematic representation of an embodiment of the present invention.

To provide stable and reliable clamping, voltage reference circuits may be used to provide the bias to transistors 200 and 210 as illustrated in FIG. 6. The embodiment of FIG. 6 offers stable performance because a transistor threshold voltage in the voltage reference circuit offsets the threshold voltage of the clamping device. For example, the first voltage reference circuit provides the bias voltage on bias line 215 with a magnitude of one P transistor threshold voltage less than the termination voltage. This assures that transistor 210 turns on when the input voltage signal reaches the termination voltage. The complementary process occurs with respect to transistor 200.

EMBODIMENT OF FIG. 2

FIG. 2 illustrates an embodiment of the invented termination circuit. This termination circuit located on an integrated circuit 250 provides clamping of an input voltage signal received from a bus 260 through interface node 150. Bus 260 is typically a bus in a computer system which is driven by other integrated circuits coupled to bus 260 or by an output buffer 100 which drives data from a data line 105 when activated using an enable line 110. Output buffer 100 may be a CMOS output buffer which drives the interface node 150 to a Vcc potential or a Vss potential of the integrated circuit. The same voltage swing results on bus 260. If bus 260 includes at least one termination resistor either as a discrete component or on another integrated circuit, the voltage swing will be reduced since the termination resistor and an output buffer driving to the opposite potential effectively form a resistive voltage divider.

The output buffer 100 could also be a Gunning Transceiver Logic (GTL) or modified GTL buffer. In one such embodiment, the bus has external resistors coupling signal lines to a termination voltage. The voltage swing in such a GTL system is from approximately the Vss potential to the termination voltage not including overshoot and undershoot. The termination resistors keep the steady state low voltage value above the Vss potential.

Thus, in general, the voltage of the bus 260 transitions between a first voltage (also referred to as a low voltage) and a termination voltage (also referred to as a high voltage or Vtt). The first voltage can be the Vss potential or can be an expected low voltage which is determined by bus drivers and terminations (if any). The termination voltage can be a separate voltage supply as in the GTL system or can be the Vcc potential as in the CMOS system.

The termination circuit of the present invention is not required to be used exclusively with an output buffer as illustrated in FIG. 2. This termination circuit could also be used in conjunction with an input buffer, an input/output buffer, or by itself, providing bus termination.

The termination circuit of FIG. 2 comprises the first and second clamping device biased by a first and second bias voltage. The first transistor, transistor 210, is the first clamping device and limits input voltage signal overshoot above the termination voltage when the first bias voltage is applied to bias line 215. Transistor 210 is a P channel MOS transistor with a threshold voltage of Vtp. Transistor 210 has a source coupled to Vss, a drain coupled to interface node 150, and a gate coupled to bias line 215. The first bias voltage of Vtt–Vtp applied to bias line 215 causes transistor 210 to turn on in response to the input voltage signal exceeding Vtt. The bias voltage may be supplied by another circuit or may be generated off of integrated circuit 250. When transistor 210 turns on, it clamps voltage overshoot above Vtt by enabling a conductive path to a first clamping voltage.

The first clamping voltage is illustrated as Vss, but could be any voltage supply with a voltage magnitude less than the termination voltage. This termination circuit clearly does not require using Vtt to supply the current which limits the overshoot. Vtt may only be required as a reference voltage to set the first bias voltage on bias line 215 rather than as a power supply capable of delivering large amounts of current. This eliminates the need to provide Vtt as an additional power bus.

A second transistor, transistor 200, is the second clamping device and limits input voltage signal undershoot below the first voltage when the second bias voltage is applied to bias line 205. Transistor 200 is an N channel MOS transistor with a threshold voltage of Vtn. The transistor 200 has a source coupled to Vcc, a drain coupled to interface node 150, and a gate coupled to bias line 205. The second bias voltage of Vss+Vtn applied to bias line 205 causes transistor 200 to turn on in response to the input voltage signal falling below Vss. When transistor 200 turns on, it clamps voltage undershoot below Vss by enabling a conductive path to a second clamping voltage. The second clamping voltage is illustrated as Vcc, but could be any voltage supply with a voltage magnitude greater than the first voltage. Again, no special power supply need be routed for this clamping voltage.

If the first voltage, the expected low voltage, is not the Vss potential, a choice may be made to either clamp signals when they fall below Vss or when they fall below the first voltage. By setting the second bias voltage one N transistor threshold above the chosen voltage level, either result may be achieved.

Figure 1:
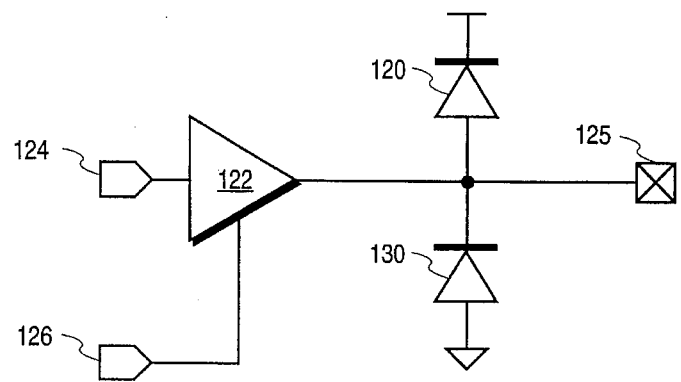
FIG. 1 is a schematic representation illustrating a prior art output circuit with clamping diodes.

The operation of the termination circuit of FIG. 2 can be better appreciated by observing the VI characteristics in FIG. 3. The prior art clamping circuit using diodes illustrated in FIG. 1 behaves according to VI characteristic 300. Voltage swings one diode drop above Vcc are clamped by diode 120. Voltage swings one diode drop below Vss are clamped by diode 130. These diodes are typically intended for ESD protection rather than limiting switching overshoot and undershoot because they do not become forward biased until after the input voltage signal has extended beyond the desired signaling range.

VI characteristic 310 represents the response of the termination circuit of FIG. 2. Since transistor 210 is biased so that the voltage between its source and gate will be its threshold voltage (Vtp) when the input voltage signal is Vtt, only low sub-threshold currents flow through transistor 210 as the input voltage signal rises from Vtt–Vtp at marker 314 to Vtt. Similarly, only sub-threshold currents flow through transistor 200 as the input voltage signal decreases from Vss+Vtn at marker 312 to Vss.

For comparison, VI characteristic 350 illustrates the current flow through a prior art resistive termination to Vtt. This resistive termination draws power at all voltages except when the input voltage signal is driven to Vtt. The present invention saves power when compared to this prior art resistive termination because the clamping devices are only fully conductive (i.e. the magnitude of the source to gate voltage exceeds the appropriate threshold voltage) when the input voltage signal goes beyond the desired signaling limits. If further power savings are desired, the first bias voltage can be increased slightly so that transistor 210 becomes conductive at a voltage slightly higher than Vtt.

FIG. 4 illustrates an input voltage signal 400 which demonstrates the reduced overshoot and undershoot resulting from the use of the invented termination circuit. The input voltage signal 400 (e.g. signal on bus) has a first transition from the first voltage (Vss) to the termination voltage (Vtt) followed by a second transition from Vtt to Vss. Waveform 410 illustrates the overshoot and waveform 420 the undershoot which would occur without the use of the termination circuit. A biasing level for transistor 210 is illustrated as $V_{BIASP}$, and a biasing level for transistor 200 is illustrated as $V_{BIASN}$. These biasing levels set clamping levels which determine when the clamping devices turn on to limit voltage swing. The equilibrium (steady-state) voltage of $V_{BIASP}$ is Vtt–Vtp, and the equilibrium voltage of $V_{BIASN}$ is Vss+Vtn.

In one embodiment, the termination circuit is fabricated on an integrated circuit such that Vtp is approximately 0.7 volts and Vtn is approximately 0.7 volts. Vtt is set to 1.5 volts, and Vss is 0 volts. In this embodiment, $V_{BIASP}$ is thus approximately 0.8 volts and $V_{BIASN}$ is approximately 0.7 volts.

In order to improve clamping ability, reduce static current consumption, or both, a bias excursion 430 of $V_{BIASP}$ may be provided responsive to the first transition of input voltage signal 400. Since the first transition can be detected when the input voltage signal 400 crosses a trip point of an input device (i.e. before the transition is complete), the bias excursion can be provided in anticipation of overshoot. Providing this bias excursion can reduce overall power consumption by allowing the equilibrium value of $V_{BIASP}$ to be slightly higher than Vtt–Vtp. This biases transistor 210 into sub-threshold conduction when the input voltage signal is at Vtt and the bias excursion 430 is not present. Consequently, between transitions, there will be less current through transistor 210 when the input voltage signal is at Vtt.

While the current consumption is reduced, the clamping ability need not be sacrificed. Bias excursion 430 can be tuned to provide at least as much clamping ability when $V_{BIASP}$ is increased as exists when $V_{BIASP}$ is constant at Vtt–Vtp. If providing maximum clamping ability is of paramount importance, $V_{BIASP}$ is maintained at Vtt–Vtp, and bias excursion 430 will turn the clamping device (transistor 210) on when the input voltage signal is at a lower voltage.

In a complementary manner, a reduction in the equilibrium value of $V_{BIASN}$ and a bias excursion 440 in $V_{BIASN}$ can be provided to affect the clamping characteristics of transistor 200. Power consumption is reduced while maintaining or improving the ability to clamp undershoot below Vss.

The effect of providing a transient reduction in $V_{BIASP}$ and a transient increase in $V_{BIASN}$ is also illustrated by VI characteristic 320 in FIG. 3. Reducing $V_{BIASP}$ causes transistor 210 to begin to turn on at marker 324 instead of marker 314. Increasing $V_{BIASN}$ causes transistor 200 to begin to turn on at marker 322 instead of marker 312. In effect, dynamic bias adjustment creates a dynamic VI characteristic varying in response to input transitions.

Embodiment of FIG. 5

In order to dynamically compensate a clamping device in response to an input transition, the termination circuit of FIG. 5 may be used. An edge detect circuit 500 is coupled to receive the input voltage signal from interface node 150. The edge detect circuit 500 is also coupled by line 505 to adjust the first bias voltage provided by a bias supply 510 on bias line 215. The edge detect circuit 500 detects the rising edge of the input voltage signal 400 illustrated in FIG. 4 and responsively controls a bias excursion 430 in the first bias voltage ($V_{BIASP}$) from bias supply 510.

The edge detect circuit 500 could be any of a number of edge detect circuits as commonly known in the art. One embodiment of the edge detect circuit 500 provides a bias voltage adjustment for a duration set by a delay circuit responsive to an input transition. Alternately, a differentiating circuit could determine a slope of the incoming signal and provide a bias excursion or adjustment proportional to the slope. The embodiment of FIG. 5 could be similarly arranged to provide adjustment of an N channel transistor clamping overshoot, or could be arranged, as in FIG. 6, to provide adjustment for both N and P channel transistors.

EMBODIMENT OF FIG. 6

FIG. 6 details a termination circuit which provides clamping of both overshoot and undershoot as well as dynamic clamping device biasing responsive to input transitions. FIG. 6 also illustrates suitable voltage reference circuits to be used by the termination circuit.

As previously, transistor 210 provides clamping of the input voltage signal when it exceeds the termination voltage, Vtt. Vtt is provided on an input node, node 605. P transistor 630 has a source coupled to node 605 and a drain and a gate coupled to node 631. P transistor 632 is similarly configured, having a source coupled to node 631 and a drain and a gate coupled to node 633. N transistor 634 has a source coupled to Vss, a drain coupled to node 633, and a gate coupled to Vcc, allowing the combination of transistors 630, 632, and 634 to provide a voltage of Vtt−2 Vtp on node 633. N transistor 634 may be replaced with several N transistors in series in order to reduce current through these three transistors. One of the transistors may have a disabling input to shut off current flow in a particular mode of operation.

P transistor 638 has a drain coupled to bias line 215, a source coupled to Vss, and a gate coupled to node 633. P transistor 636 is a bias transistor having a source coupled to Vtt (node 605), and a drain and a gate coupled to bias line 215. This arrangement provides the first bias voltage of Vtt−Vtp on bias line 215.

Transistors 640 and 642 provide an anticipatory bias excursion in the first bias voltage in response to a rising edge on interface node 150 by enabling a resistive connection between bias line 215 and a pulldown voltage potential, Vss. An input buffer 660 is coupled to receive the input voltage signal and is coupled to a delay 650. Since input buffer 660 is an inverting input buffer and delay 650 is non-inverting, the input voltage signal is provided in inverted form at the output of delay 650. Assuming that the input voltage signal starts at a logical 0, the gate of transistor 640 will have a 0 (turning it off), and the gate of transistor 642 will have a 1 (turning it on).

When interface node 150 receives an input voltage signal which switches from a 0 to a 1, the gate of transistor 640 receives a 1 (turning it on). At this point, bias line 215 is pulled down by the resistive connection through transistors 640 and 642 until the input transition propagates through delay 650 and switches transistor 642 off. The duration of delay 650 can be used to determine the magnitude of the bias excursion of the first bias voltage on bias line 215. The bias excursion (a transient reduction of the first bias voltage) increases the clamping of transistor 210 as previously discussed.

Also, as previously, transistor 200 provides clamping of the input voltage signal when it falls below the first voltage which is Vss in this embodiment. Node 600 provides a voltage supply which is greater than 2 Vtn. Either Vcc or Vtt may be used, and in this embodiment, node 600 is coupled to Vcc. Node 602 provides a pullup potential greater than Vtn, and in this embodiment, Vtt is used. N transistor 614 has a source coupled to Vss and a drain and a gate coupled to node 613. N transistor 612 is similarly configured, having a source coupled to node 613 and a drain and a gate coupled to node 611. P transistor 610 has a source coupled to node 600, a drain coupled to node 611, and a gate coupled to Vss, allowing the combination of transistors 610, 612, and 614 to provide a voltage of Vss+2 Vtn on node 611. P transistor 610 may be replaced with several P transistors in series in order to reduce current through these three transistors. One of the transistors may have a disabling input to shut off current flow in a particular mode of operation.

N transistor 618 is a bias transistor having a gate and a drain coupled to bias line 205, and a source coupled to Vss. N transistor 616 has a source coupled to Vcc (node 600), a drain coupled to bias line 205, and a gate coupled to node 611. This arrangement provides the second bias voltage of Vss +Vtn on bias line 205.

Transistors 620 and 622 provide a bias excursion in the second bias voltage in response to a falling edge on interface node 150 by enabling a resistive connection between bias line 205 and a pullup voltage potential, Vtt. Assuming that the input voltage signal starts at a logical 1, the gate of transistor 622 will have a 1 (turning it off), and the gate of transistor 620 will have a 0 (turning it on).

When interface node 150 receives an input voltage signal which switches from a 1 to a 0, the gate of transistor 622 receives a 0 (turning it on). At this point, bias line 205 is pulled up by the resistive connection through transistors 620 and 622 until the input transition propagates through delay 650 and switches transistor 620 off. Although delay circuit 650 affects the magnitude of both the bias excursion on bias line 215 and the bias excursion on bias line 205, the duration and magnitude of these bias excursions may differ due to asymmetric response of the input buffer 660 or the transistors forming the resistive connections. The bias excursion (a transient increase of the second bias voltage) provided by the resistive connection on bias line 205 improves the clamping of transistor 200 as previously discussed.

Thus, the present termination circuit provides low power termination for a bus in a computer system. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A termination circuit having an interface node for receiving an input voltage signal, comprising:

a first clamping device having a control terminal and a first threshold voltage, the first clamping device coupled to the interface node and coupled to receive a first clamping voltage; and a first bias supply for providing a first bias voltage, the first bias supply having a first equilibrium voltage of approximately the first threshold voltage less than a termination voltage, wherein the control terminal is coupled to receive the first bias voltage and the first clamping device clamps the interface node if the input voltage signal exceeds the first bias voltage by the first threshold voltage.

2. The termination circuit of claim 1 wherein the first bias supply provides an anticipatory bias excursion in response to a first transition from a first voltage to the termination voltage.

3. The termination circuit of claim 1 further comprising an edge detect circuit coupled to the interface node and coupled to the first bias supply to provide a bias excursion.

4. The termination circuit of claim 3 wherein bias excursion that the edge detect circuit provides is a transient reduction in the first bias voltage, the transient reduction having a first duration and being provided responsive to a first transition by enabling a resistive connection to a pulldown voltage less than the first equilibrium voltage.

5. The termination circuit of claim 4 wherein the edge detect circuit comprises a delay circuit having a delay output and a delay input, the delay input being coupled to the interface node, and a first and second transistor connected in series coupling the pulldown voltage to the first bias voltage, the first transistor having a first gate coupled to the interface node, and the second transistor having a second gate coupled to the delay output.

6. The termination circuit of claim 5 wherein the first clamping device is a P channel MOS transistor, and the first clamping voltage and the pulldown voltage are a Vss potential.

7. The termination circuit of claim 1 wherein the first bias supply comprises a voltage reference circuit having a bias transistor coupled to the termination voltage to provide the first bias voltage.

8. In a computer system having a bus, a termination circuit having an interface node coupled to the bus to receive an input voltage signal having a transition from a termination voltage to a ground voltage less than the termination voltage, comprising:

a transistor having a gate and a threshold voltage, the transistor being coupled to the interface node and coupled to receive a Vcc voltage; and a bias supply having a bias voltage, the bias voltage having a bias excursion provided responsive to the transition, wherein the gate is coupled to receive the bias voltage, and the transistor clamps undershoot on the interface node when the input voltage signal is less than the bias voltage by the threshold voltage.

9. The termination circuit of claim 8 wherein the transistor is an N channel MOS transistor.

10. A termination circuit having an interface node coupled to receive an input voltage signal which has a first transition from a first voltage to a termination voltage greater than the first voltage and a second transition from the termination voltage to the first voltage, comprising:

a first clamping device having a first control terminal and a first threshold voltage, the first clamping device being coupled to the interface node and coupled to a first clamping voltage;

a first bias supply for providing a first bias voltage, the first bias supply having a first equilibrium voltage of approximately the first threshold voltage less than the termination voltage, the first control terminal coupled to receive the first bias voltage;

a second clamping device having a second control terminal and a second threshold voltage, the second clamping device being coupled to the interface node and coupled to a second clamping voltage; and a second bias supply for providing a second bias voltage, the second bias supply having a second equilibrium voltage of approximately the second threshold voltage greater than the first voltage, the second control terminal coupled to receive the second bias voltage, wherein the first clamping device clamps the interface node if the input voltage signal exceeds the first bias voltage by the first threshold voltage, and the second clamping device clamps the interface node if the input voltage signal is less than the second bias voltage by the second threshold voltage.

11. The termination circuit of claim 10 wherein the first voltage is approximately a Vss potential, the first clamping voltage is the Vss potential, and the second clamping voltage is a Vcc potential.

12. The termination circuit of claim 10 wherein the first bias supply provides a first bias excursion decreasing the first bias voltage for a first duration in response to the first transition, and the second bias supply provides a second bias excursion increasing the second bias voltage for a second duration in response to the second transition.

13. The termination circuit of claim 12 further comprising a delay circuit having a delay output and a delay input coupled to the interface node, a first and second transistor connected in series coupling a pulldown voltage to the first bias voltage, and a third and a fourth transistor connected in series coupling a pullup voltage to the second bias voltage, the first and the third transistor each having a gate coupled to the interface node, the second and the fourth transistor each having a gate coupled to the delay output.

14. A termination circuit having an interface node coupled to a bus in a computer system to receive an input voltage signal having a first transition from a first voltage to a termination voltage greater than the first voltage and having a second transition from the termination voltage to the first voltage, comprising:

a first transistor having a first gate and a first threshold voltage, the first transistor coupled to the interface node and coupled to a Vss potential, the Vss potential being less than the termination voltage;

a first bias supply having a first bias voltage, the first bias supply having a first equilibrium voltage of approximately the first threshold voltage less than the termination voltage, the first bias voltage having a first bias excursion provided responsive to the first transition, the first gate being coupled to receive the first bias voltage, and the first transistor clamping overshoot on the interface node when the input voltage signal exceeds the first bias voltage by the first threshold voltage;

a second transistor having a second gate and a second threshold voltage, the second transistor coupled to the interface node and coupled to a Vcc potential, the Vcc potential being greater than the first voltage; and a second bias supply having a second bias voltage, the second bias supply having a second equilibrium voltage of approximately the second threshold voltage greater than the Vss potential, the second bias voltage having a second bias excursion provided responsive to the second transition, the second gate being coupled to receive the second bias voltage, the second transistor clamping undershoot on the interface node when the input voltage signal is less than the second bias voltage by the second threshold voltage.

15. The termination circuit of claim 14 wherein the first bias excursion is a transient reduction in the first bias voltage, and the second bias excursion is a transient increase in the second bias voltage.

16. The termination circuit of claim 14 further comprising a delay circuit having a delay output and a delay input coupled to the interface node, a first and second transistor connected in series coupling the Vss potential to the first bias voltage, and a third and a fourth transistor connected in series coupling the termination voltage to the second bias voltage, the first and the third transistor each having a gate coupled to the interface node, the second and the fourth transistor each having a gate coupled to the delay output.

17. The termination circuit of claim 14 wherein the first bias supply comprises a first voltage reference circuit having a first bias transistor coupled to the termination voltage to provide the first bias voltage, and the second bias supply comprises a second voltage reference circuit having a second bias transistor coupled to the first voltage to provide the second bias voltage.

18. A termination circuit having an interface node coupled to a computer system bus to receive an input voltage signal which has a first transition from a first voltage to a termination voltage, comprising:

clamping means, coupled to the interface node, for limiting a voltage swing of the input voltage signal to approximately a first clamping level;

biasing means for biasing the clamping means using a first biasing level to set the first clamping level;

adjusting means, coupled to the biasing means and coupled to receive the input voltage signal, for adjusting the first biasing level in response to the first transition.

19. The termination circuit of claim 18 wherein the first voltage is less than the termination voltage, the clamping means limits the voltage swing of the input voltage signal exceeding the termination voltage, and the input voltage signal has a second transition from the termination voltage to the first voltage, further comprising:

second clamping means, coupled to the interface node, for limiting a second voltage swing of the input voltage signal below a second clamping level;

second biasing means for biasing the second clamping means using a second biasing level to set the second clamping level;

second adjusting means, coupled to the second biasing means and coupled to receive the input voltage signal, for adjusting the second biasing level in response to the second transition.

20. A termination circuit having an interface node coupled to a bus in a computer system to receive an input voltage signal having a first transition from a first voltage to a termination voltage, Vtt, greater than the first voltage and having a second transition from Vtt to the first voltage, comprising:

a first transistor coupled to the interface node and coupled to a ground potential, Vss, the first transistor having a first gate and a first threshold voltage, Vtp;

a second transistor coupled to the interface node and coupled to a power supply potential, Vcc, the second transistor having a second gate and a second threshold voltage, Vtn;

a first bias supply having a first bias output voltage of $V_{BIASP}$, $V_{BIASP}$ having a first equilibrium value of approximately Vtt−Vtp, the first gate being coupled to receive $V_{BIASP}$;

a second bias supply having a second bias output voltage of $V_{BIASN}$, $V_{BIASN}$ having a second equilibrium value of approximately Vss+Vtn, the second gate being coupled to receive $V_{BIASN}$.

21. The termination circuit of claim 20 wherein $V_{BIASP}$ has a transient bias reduction provided responsive to the first transition, and $V_{BIASN}$ has a transient bias increase provided responsive to the second transition.

22. A method of limiting overshoot of a signal above a termination voltage of a bus in a computer system, comprising the steps of:

clamping the signal using a voltage potential less than the termination voltage if the signal exceeds the termination voltage, the clamping occurring under control of a bias voltage;

detecting a transition of the signal from a low voltage to the termination voltage; and providing a bias excursion of the bias voltage to clamp the signal if the signal exceeds a second voltage less than the termination voltage.

23. A method of limiting undershoot of a signal below a low voltage of a bus in a computer system, comprising the steps of:

clamping the signal using a voltage potential greater than the low voltage, if the signal falls below the low voltage, the clamping occurring under control of a bias voltage;

detecting a transition of the signal from a high voltage to the low voltage; and providing a bias excursion of the bias voltage to clamp the signal if the signal falls below a second voltage greater than the low voltage.

* * * * *